(12) United States Patent
Yao et al.

(10) Patent No.: US 9,911,574 B2
(45) Date of Patent: Mar. 6, 2018

(54) SCANNING PROBE LITHOGRAPHY METHODS UTILIZING AN ENCLOSED SINUSOIDAL PATTERN

(71) Applicant: The Trustees of Princeton University, Office of Technology and Trademark Licensing, Princeton, NJ (US)

(72) Inventors: Nan Yao, Princeton, NJ (US); Wei Cai, Princeton, NJ (US)

(73) Assignee: The Trustees of Princeton University, Office of Technology and Trademark Licensing, Princeton, NJ (US)

( * ) Notice: Subject to any disclaimer, the term of this patent is extended or adjusted under 35 U.S.C. 154(b) by 0 days.

(21) Appl. No.: 15/235,717

(22) Filed: Aug. 12, 2016

(65) Prior Publication Data
US 2017/0047199 A1 Feb. 16, 2017

Related U.S. Application Data

(60) Provisional application No. 62/205,420, filed on Aug. 14, 2015.

(51) Int. Cl.
*H01J 37/20* (2006.01)
*H01J 37/28* (2006.01)
*H01J 37/317* (2006.01)

(52) U.S. Cl.
CPC ... *H01J 37/3174* (2013.01); *H01J 2237/2602* (2013.01); *H01J 2237/3175* (2013.01)

(58) Field of Classification Search
CPC ...... H01J 37/20; H01J 37/28; G01N 21/6489; G01N 21/8806; G01N 21/9501
USPC ............. 250/226, 307, 310, 311, 398, 443.1, 250/458.1, 459.1, 492.2, 492.22
See application file for complete search history.

(56) References Cited

U.S. PATENT DOCUMENTS

| | | | | |
|---|---|---|---|---|
| 4,487,635 A | * | 12/1984 | Kugimiya | H01L 21/8221 257/69 |
| 5,898,177 A | * | 4/1999 | Hidaka | H01J 37/20 250/311 |
| 6,203,968 B1 | * | 3/2001 | Igarashi | G11B 7/261 369/111 |
| 7,897,942 B1 | * | 3/2011 | Bareket | G03B 27/62 250/398 |
| 2011/0260057 A1 | * | 10/2011 | Otaka | H01J 37/20 250/307 |

(Continued)

FOREIGN PATENT DOCUMENTS

JP 09269328 A 10/1997

OTHER PUBLICATIONS

Yong, et al.; Video-Rate Lissajous-Scan Atomic Force Microscopy; IEEE Transactions on Nanotechnology, vol. 13, No. 1, Jan. 2014.
(Continued)

*Primary Examiner* — David A Vanore
(74) *Attorney, Agent, or Firm* — Moser Taboada

(57) ABSTRACT

Provided among other things are a scanning electron microscope, scanning transmission electron microscope, focused ion beam microscope, ion beam micromachining device, or scanning probe nanofabrication device, wherein the microscope or device is configured to move a substrate and a scanning modality relative to one another with an enclosed sinusoidal trajectory, and methods of operation.

19 Claims, 8 Drawing Sheets

(56) References Cited

U.S. PATENT DOCUMENTS

2015/0001421 A1* 1/2015 Sappey .............. G01N 21/6489
  250/459.1
2017/0047199 A1* 2/2017 Yao .................... H01J 37/3174

OTHER PUBLICATIONS

Azaei, et al.; High-speed Lissajous-scan atomic force microscopy: Scan pattern planning and control design issues; Review of Scientific Instruments 83, 063701 (2012), American Institute of Physics.
Tuma, et al.; High-speed multiresolution scanning probe microscopy based on Lissajous scan trajectories, Nanotechnology 23 (2012) 185501; IOP Publishing Ltd.

* cited by examiner

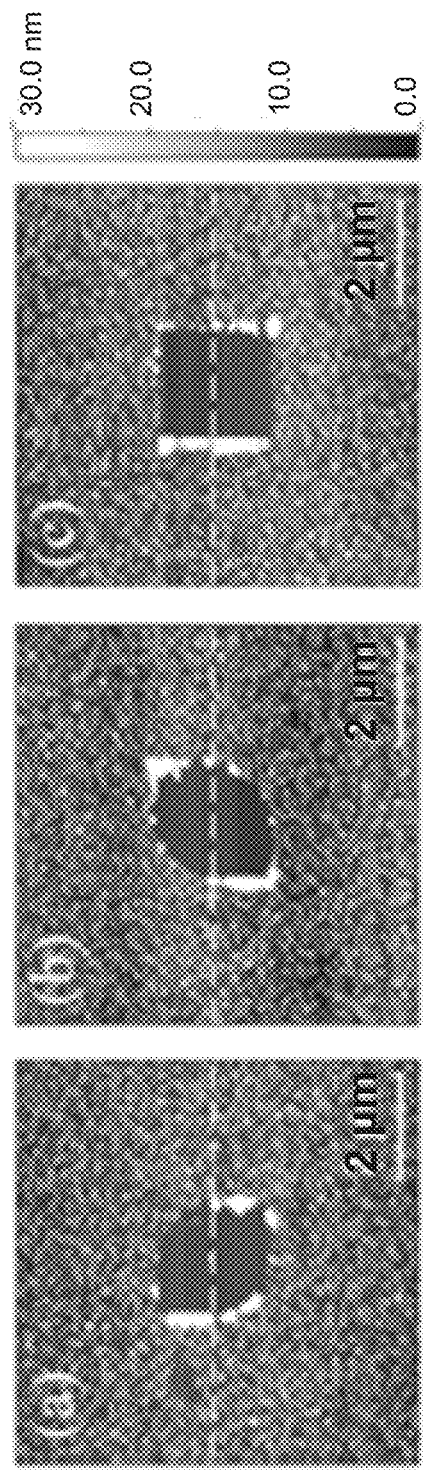
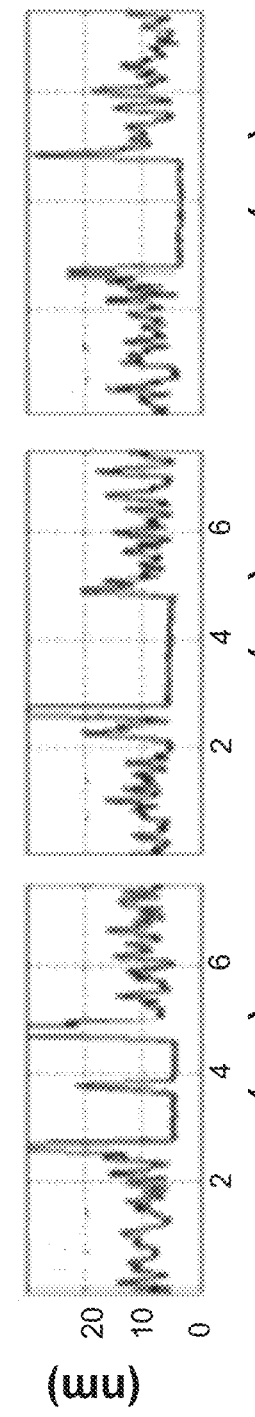
Fig. 6A  Fig. 6B  Fig. 6C
Fig. 6D  Fig. 6E  Fig. 6F

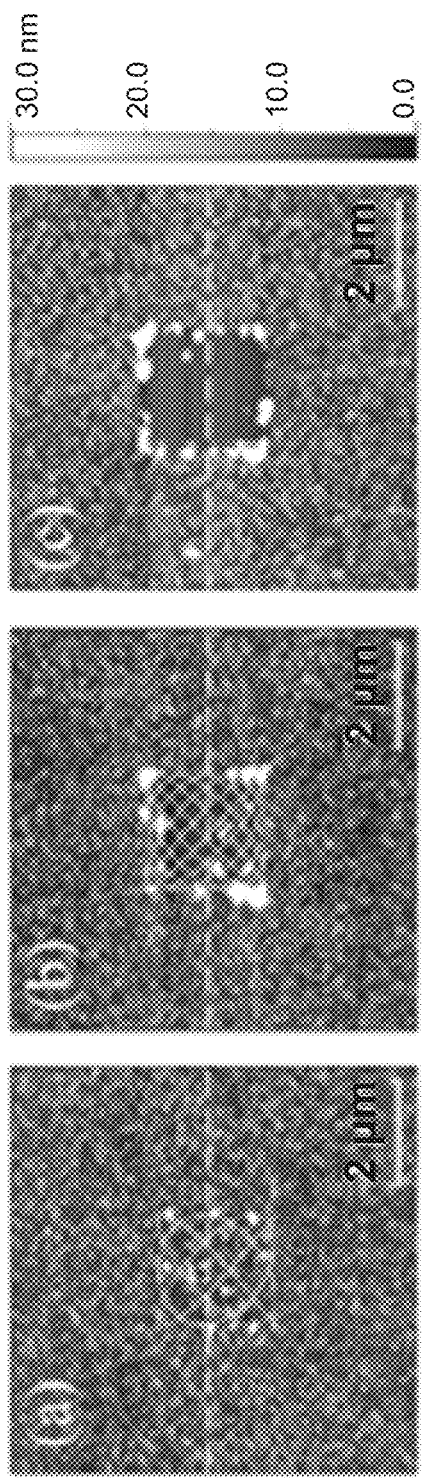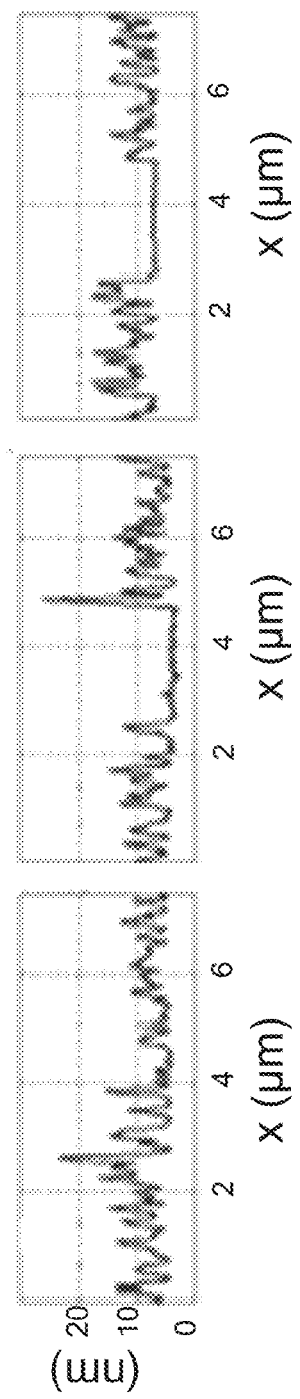
Fig. 7A  Fig. 7B  Fig. 7C
Fig. 7D  Fig. 7E  Fig. 7F

SCANNING PROBE LITHOGRAPHY METHODS UTILIZING AN ENCLOSED SINUSOIDAL PATTERN

This application claims the priority of U.S. Provisional Application No. 62/205,420, filed Aug. 14, 2015, the contents of which are incorporated herein in their entirety.

The present application relates generally to methods of scanning probe nanofabrication and ion beam micromachining that utilize an enclosed sinusoidal trajectory, such as a spiral, cycloid or Lissajous trajectory, to move the tip or beam, or the support for the substrate. The present invention further relates to using such trajectories to move the substrate, electron or ion beam, or the magnetic lens, in scanning electron microscopy, scanning transmission electron microscopy, or ion beam microscopy. The invention further relates to devices programmed to drive the machining (lithograpy, nanofabrication) or microscopy with an enclosed sinusoidal trajectory.

Scanning probe nanofabrication (SPN) is a flexible and low-cost method for the preparation of nanoscale structures on the surface of various kinds of materials. Depending on different types of SPN tips, a lot of tip-sample interactions can be utilized for material surface modifications, including mechanical, electrical, chemical, and thermal modifications. For instance, top-down nanostructures patterned on metal, semiconductor, insulator, and polymer surface were fabricated by mechanical scratching/nanoshaving methods. Versatile structures on surfaces can be directly written by bias induced local anodic oxidation (LAO) method and dip-pen nanolithography. Three-dimensional structures can be prepared by local desorption with a heatable probe. Due to the inherent nature of the scanning probe microscope (SPM), raster scan patterns are required for both imaging and nanofabrication. Structures consisting of lines on the surface can be fabricated by raster scan patterns. For complex or irregular patterns, vector-scan controlled nanolithography has been proposed to move the tip along a desired path. But the fabrication speed is limited to several nanometers per second. Enhanced raster scan patterns have been proposed by a rotating-tip-based technique or in-plane circular vibration method. In these methods, the tip did circular motions during the fabrication processes, which were helpful in increasing the lithographic throughput.

Lissajous trajectory has been used to direct scanning probe microscopy, but the benefits for lithography methods has not been recognized.

SUMMARY

Provided among other things are a scanning electron microscope, scanning transmission electron microscope, focused ion beam microscope, ion beam micromachining device, or scanning probe nanofabrication device, wherein the microscope or device is configured to move a substrate and a scanning modality relative to one another with an enclosed sinusoidal trajectory, and methods of operation.

DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

FIGS. 6A to 6C show scanning probe microscopy of the product of scanning probe nanofabrication according to the invention;

FIGS. 6D to 6F show cross-section lines from the scanning probe microscopy represented in FIGS. 6A to 6C;

FIGS. 7A to 7C show scanning probe microscopy of the product of scanning probe nanofabrication according to the invention;

FIGS. 7D to 7F show cross-section lines from the scanning probe microscopy represented in FIGS. 7A to 7C;

Figure 1A:
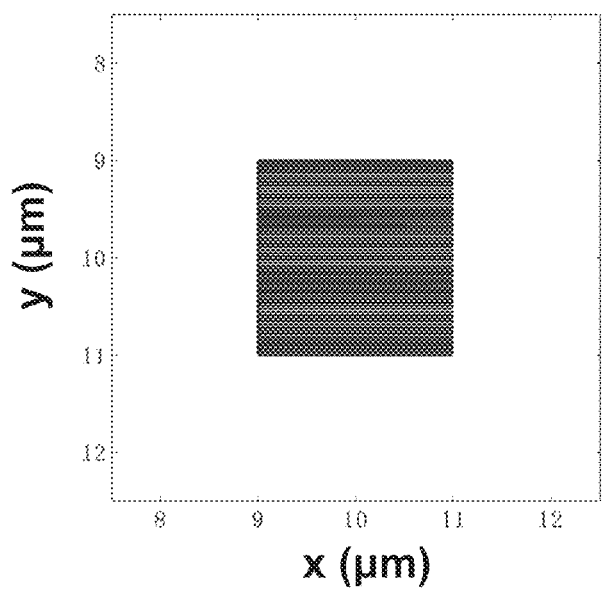
FIG. 1A depicts a raster-based scan pattern.

To facilitate understanding, identical reference numerals have been used, where possible, to designate comparable elements that are common to the figures. The figures are not drawn to scale and may be simplified for clarity. It is contemplated that elements and features of one embodiment may be beneficially incorporated in other embodiments without further recitation.

DETAILED DESCRIPTION

The scan utilizes sine and cosine waveforms (together, "sinusoidal) compared to the triangle waveforms used in the traditional raster scan scanning probe nanofabrication ("SPN") to drive the scanning process. It provides smoother driving waveforms which can speed up the fabrication process without exciting the scanner's oscillation at higher-order harmonics. The method can further build structures with incorporated rectangular.

The scan time per frame can be reduced from minutes to seconds. Moreover, the method enables control of several pattern shapes (e.g. rectangular, circular, elliptical, parabola, capsule, parallelogram, and the like), the scan dimension (within the maximum range of the scanner), and the scan line density (the maximum value depends on the size of the tip) of the fabrication area. Adjusting the frequency and amplitude parameters of the waveform can tune the pattern's size and the density of the trajectory. Moreover, the nanofabrication process can be previewed early in the process to assure that the construct is correctly located and shaped. Further, the preview function can show that fabrication parameters are met prior to the end of the full program. The process can be used with any SPN technology, including for example dip-pen, local anodic oxidation, and triboelectrification.

The method has applications in cost-effective surface modifications, nanolithography, and nanofabrication. The method can be employed in all scanning probe microscope instruments to reduce the tip-based fabrication time down to for example several seconds. Such SPN nanofabrication can be used for example to fabricate patterns on polymer surfaces, electrodes for energy storage, energy conversion devices such as solar cells, and sensors such as biological sensors. Quantum dots (whose optoelectronic properties change as a function of both size and shape) can be fabricated, and can be used in sensors. Surfaces with localized electrical charge can be fabricated. These localized charges can in turn be utilized to attract or repel material applied in a further fabrication step.

Figures 3A, 3B, 3C:
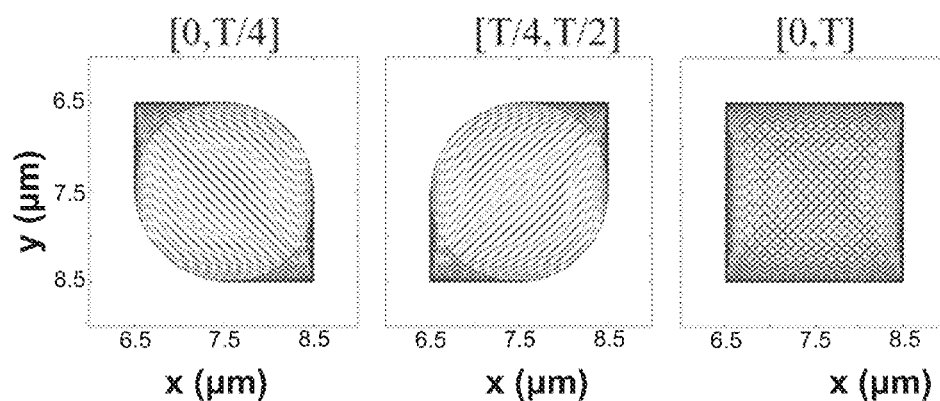
FIGS. 3A to 3C show various scan patterns according to the invention.

An "enclosed sinusoidal trajectory" is illustrated for example by any of the patterns set forth in FIGS. 3A to 3F. An enclosed sinusoidal trajectory includes a period of Lissajous trajectory as shown in FIG. 3C. An enclosed sinusoidal trajectory is one that is mathematically reflected to be enclosed within a 2-dimensional area.

Movement is driven by sine or cosine waveforms, which those of skill in light of this specification can defined depending on the pattern shapes, resolution (i.e. the size of the tip), and the scan period (typically several seconds using the invention). Control of the scan process is performed by moving the tip pursuant to the waveforms, utilizing different tip-sample interactions, for example mechanical or electrical interactions. The fabricated patterns can be on the various material surfaces, such as semiconductors, metals, ceramics, or polymer films.

After fabrication, or partial fabrication in preview mode, the patterns can verified in-situ using imaging mode of the same scanning probe microscope. Accordingly, the alignment calibration of the microscope is still in place.

Mechanical scratching and the tip-based triboelectrification experiments using the disclosed approach have been successfully implemented. The resultant morphology of the modified surfaces and the triboelectric charges generated within the tip rubbed area were characterized in-situ by the tapping mode atomic force microscopy ("AFM") and scanning Kelvin force microscopy, respectively.

Figure 1B:
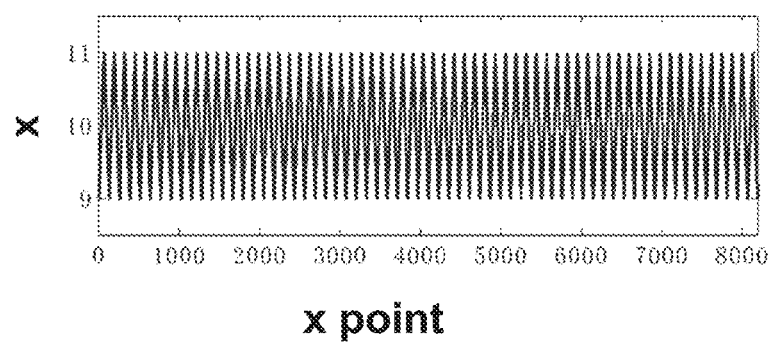
FIGS. 1B and 1C show corresponding driving waveforms for the x- and y-axes.
Figure 1C:
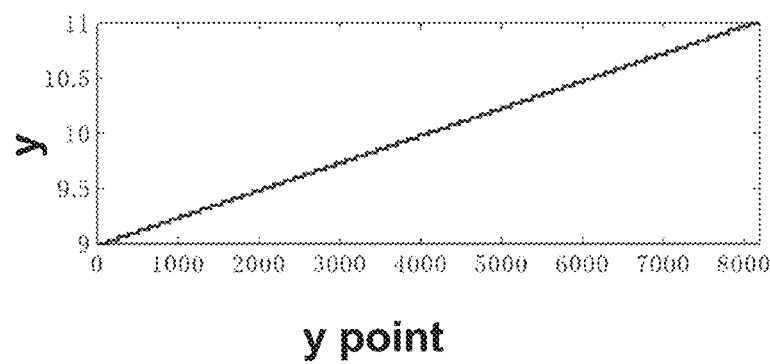

FIG. 1A shows the result of a raster-based drive program. FIGS. 1B and 1C are the driving waveforms for the x- and y-axes. The total points per axis for the pattern are 8192. While sub-portions of a fabrication according to the invention might use a raster-based program, some part of the fabrication is conducted according to the method driven with sinusoidal waveforms.

Figure 2A:
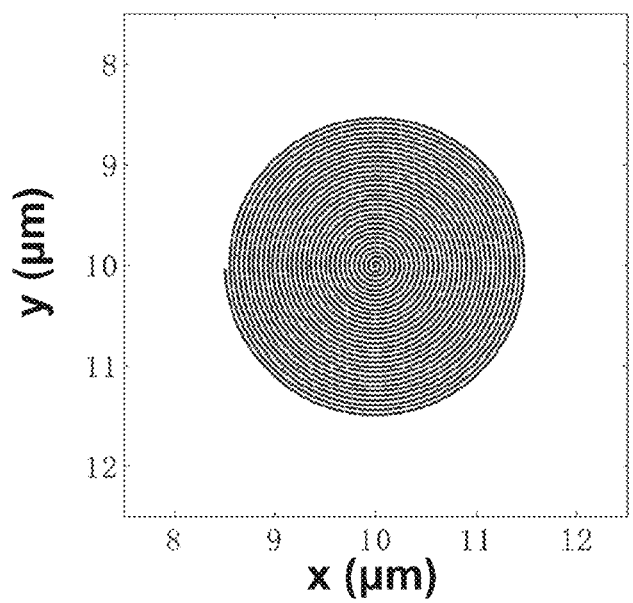
FIG. 2A depicts a non-raster-based scan pattern.
Figure 2B:
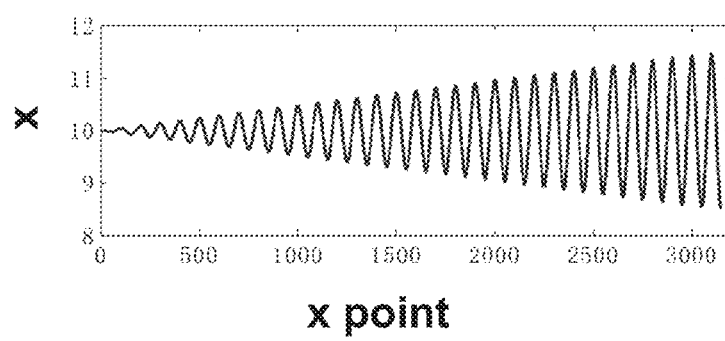
FIGS. 2B and 2C show corresponding driving waveforms for the x- and y-axes.
Figure 2C:
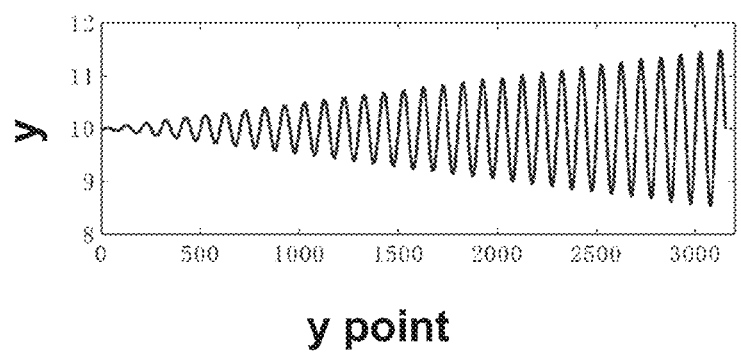

FIG. 2A shows the result of a sinusoidal drive program. FIGS. 2B and 2C are the driving waveforms for the x- and y-axes. The total points per axis for the pattern are 3151.

Additional results of sinusoidal drive programs are provided in FIGS. 3A through 3F, as discussed further below. As can be seen, corner structures with substantially straight-line edges can be obtained.

The method can be employed to produce scanning probe microscopy (SPM) instruments and probe-based nanolithography machines having programming for driving the scan in this manner.

Typically, such device are moved by moving a support upon which the substrate for fabrication is mounted. The tip portion of the device can also be moved. Typically, movement is effected by applying voltage to piezoelectric material. For example, once an appropriate waveform is selected for driving the x-axis and the y-axis, a microprocessor converts the waveform-determined value to the voltage value to one or move sites on the piezoelectric scanner that effects the corresponding movement (which may be pursuant to extensive calibration).

In embodiments, the probe tip is moved towards and away from the substrate so as to minimize destructive encounters with the substrate.

Figure 4:
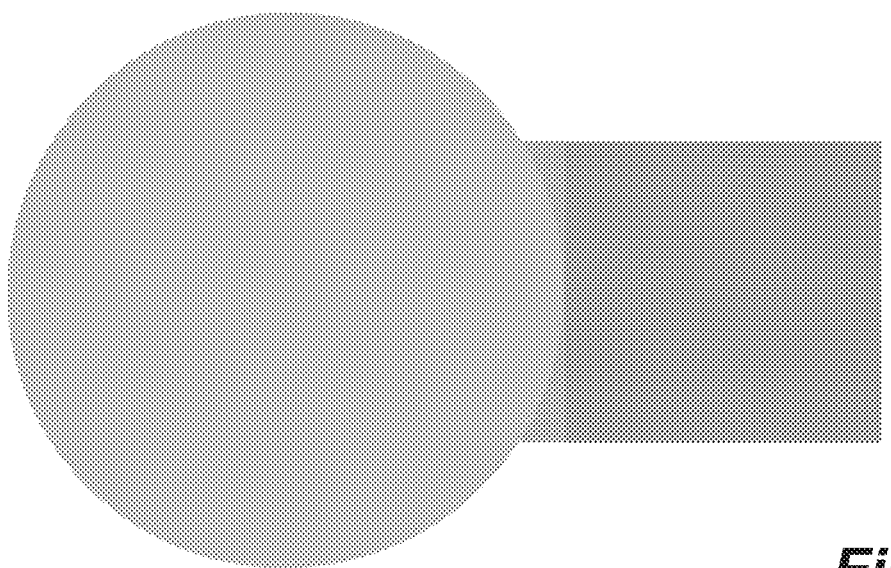
FIG. 4 shows shapes that can be fabricated with the invention.

In embodiments, the method of the invention fabricates shapes that include rectangular shapes. It may be that one face of the rectangle is hidden by other shapes in the fabrication, but if the triangle or rectangle can be clearly discerned, that shape is included in the fabrication. FIG. 4 shows an example.

Figure 5:
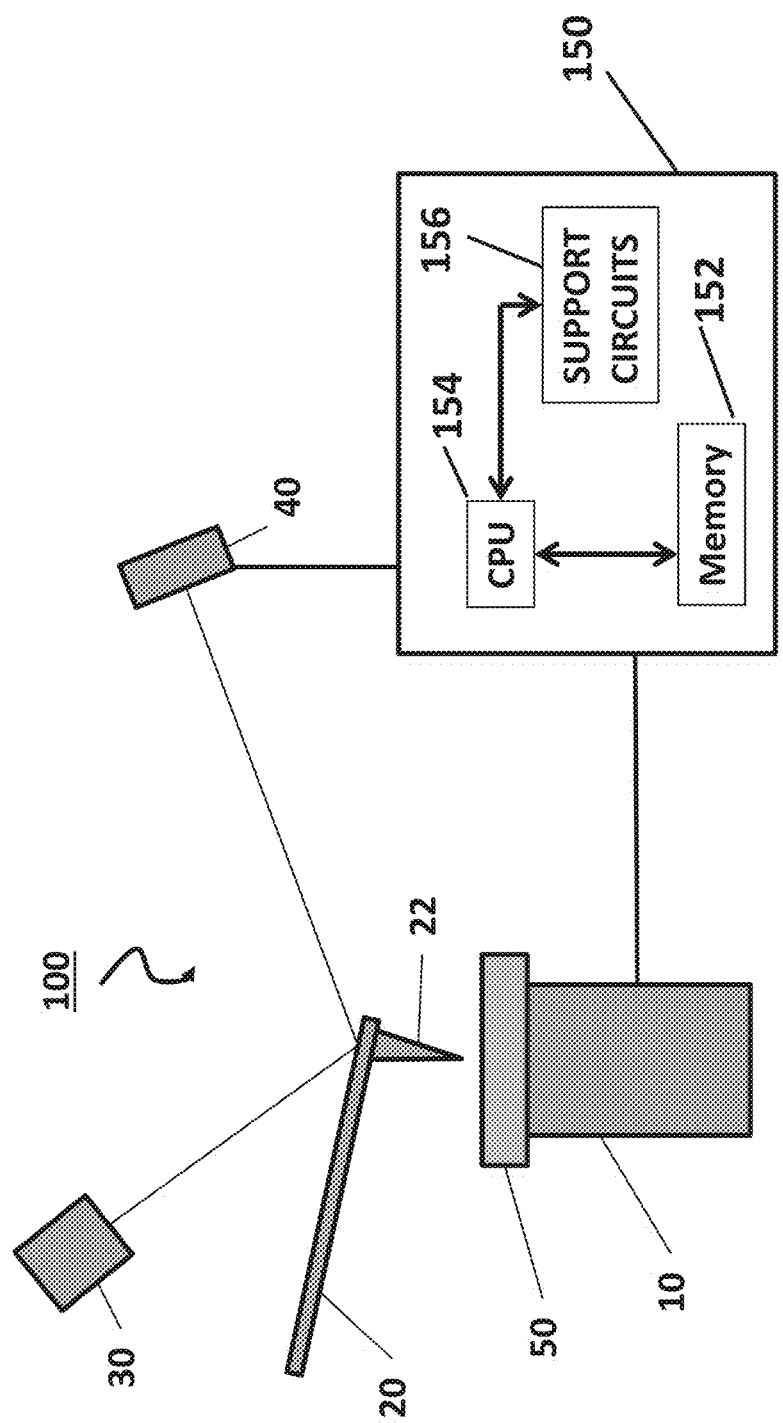
FIG. 5 shows a nanofabrication device of the invention.

FIG. 5 shows an exemplary SPN 100 according to the invention. Substrate 50 rests or is reversibly affixed to piezoelectric scanner 10 (with x, y and z movement). Cantilever 20 positions probe 22 on or near the surface of sample 50. Laser 30 bounces light off of cantilever 20 to segmented light detector 40 (e.g., photodiode). Controller 150 operates to send instructions to the piezoelectric scanner 10 on movement. Feedback control based on data from the light detector 40 can operate to change the operation of the piezoelectric scanner 10, such as if the probe 22 needs to be moved away from the substrate in light of an obstacle. It will be recognized that piezoelectric movement control can be with respect to the cantilever rather than the substrate.

The instrumentation described here can have a controller 150, which can comprise a central processing unit (CPU) 154, a memory 152, and support circuits 156 for the CPU 154 and is coupled to and controls the SPN or, alternatively, operates to do so in conjunction with computers (or controllers) connected to the SPN.

For example, another electronic device can supply software, or operations may be calculated off-site with controller 150 coordinating off-site operations with the local environment. The controller 150 may be one of any form of general-purpose computer processor, state machine, or an array of processors, that can be used for controlling various devices and sub-processors. The memory, or computer-readable medium, 152 of the CPU 54 may be one or more of readily available memory technologies such as random access memory (RAM), read only memory (ROM), flash memory, floppy disk, hard disk, ReRAM, magnetic memory, or any other form of digital storage, local or remote. The support circuits 156 are coupled to the CPU 154 for supporting the processor in a conventional manner. These circuits can include cache, power supplies, clock circuits, address decoders, input/output circuitry and subsystems, and the like. Methods of operating the synthesizer may be stored in the memory 152 as software code that may be executed or invoked to control the operation of the synthesizer. The software may also be stored and/or executed by a second CPU (not shown) that is remotely located from the hardware being controlled by the CPU 154. While the above discussion may speak of the "controller" taking certain actions, it will be recognized that it may take such action in conjunction with connected devices with computation power.

Ion beam devices are arranged in the same manner, except the piezoelectric devices can be used to move the substrate, or the enclosed sinusoidal pattern can operated by moving the ion beam. Calibration functions can be applied to convert the enclosed sinusoidal pattern to appropriate driving currents to establish a trajectory having a sinusoidal motion profile for moving the ion beam (e.g. via electromagnets) or the enclosed sinusoidal pattern can be operated to move the ion beam.

Microscope embodiments are arranged in the same manner, except the piezoelectric devices can be used to move the substrate, or the enclosed sinusoidal pattern can operated by moving the electron beam. Calibration functions can be applied to convert the enclosed sinusoidal pattern to appropriate driving currents to establish a trajectory having a sinusoidal motion profile for moving the electron beam (e.g. via electromagnets) or the enclosed sinusoidal pattern can be operated to move the electron beam.

Exemplary Discussion of SPN with Lissajous Trajectories

In this section, firstly we present the methods to calculate the Lissajous scan trajectories for SPN surface modifications based on single-tone waveforms and multiple-frequency waveforms. As demonstrations, Example 1 below show experiments based on the tip mechanical scratching with two kinds of Lissajous trajectories were carried out. The resultant morphologies of the modified surfaces were characterized by the tapping mode AFM. As a further exemplary application, in Example 2 below triboelectrification induced by a scanning SPN tip on silicon dioxide surface with Lissajous trajectories was investigated. The triboelectric charges accumulated within the tip rubbed area on the surface were characterized in-situ by using the scanning Kelvin probe force microscopy (SKPM). These demonstrations confirm a cost-effective approach for surface modifications and nanofabrication.

To develop Lissajous trajectories used for AFM nanofabrication, trajectories can be expressed by two single-tone cosine waveforms as shown in equation (1). The phase values of the waveforms are set to zero. $A_x$ and $A_y$ represent the scan range. $x_0$ and $y_0$ are the scan offset. There is a small difference between the two frequencies $f_x$ and $f_y$. Typically, assuming $f_x > f_y$, the ratio of the frequencies $f_x/f_y$, which is rational, can be expressed by equation (2). Where, N is a natural number for the ratio control. The value of N is inversely proportional to the frequency difference. The shape of the Lissajous trajectory is highly sensitive to the frequency ratio, thus the pattern can be designed by choosing different values of N. If N is large enough, the Lissajous trajectories can cover the whole rectangular area with the size of $A_x$ by $A_y$.

$$X = x_0 + A_x \cos(2\pi f_x t), \quad (1)$$
$$Y = y_0 + A_y \cos(2\pi f_y t)$$

$$\frac{f_x}{f_y} = \frac{2N}{2N-1} \quad (2)$$

The trajectory can be calculated as follows. Firstly, the target resolution of the Lissajous trajectory h is defined by the distance between the two nearest cross points around the origin. When N is a large number and assuming that $A_x = A_y = A$, then N can be determined by using the equation (3).

$$N \approx \left[\frac{\pi}{\sqrt{2}} \frac{A}{h}\right] \quad (3)$$

In this situation, if $f_x$ is known, then the $f_y$ can be determined by equation (2). Finally, after setting the offsets $x_0$ and $y_0$, the trajectory can be determined by equation (1) and the period of the trajectory can be expressed by equation (4).

$$T = \frac{1}{|f_x - f_y|} = \frac{2N}{f_x} \quad (4)$$

It worth noticing that only with a half-period of the Lissajous trajectory, the squared area can be fully scanned. So in experiments, one scan method is implemented by directly using a half-period of the designed Lissajous trajectory. By applying a small normal force on the tip, the surface can be scratched by the scanning tip and a squared area can be patterned in this way.

Another scan method of nanofabrication is based on the multi-frequency resolution Lissajous scanning. In this method, the frequency (e.g. $f_y$) is not fixed during the scan period, as shown in equation (5). The whole scan time can be divided into M parts. For every value of M, except for the first part, the time duration is a half-period Lissajous trajectory with a period of $T_m$, as shown in equation (6). For example, if M=4, the first part of the signal is a full period ($T_1=T/8$) of Lissajous trajectory (in order to align with the time segments in the former method). The second part is a half-period ($T_2=T/4$) of Lissajous trajectory. The third part is a half-period ($T_3=T/2$) and the fourth part is a half-period ($T_4=T$) of Lissajous trajectory, respectively. The corresponding frequency fy,m can be expressed by equation (7), where $\Delta f$ is the difference of two frequencies. Phase shift $\phi_m$ in a trajectory part, which is given in equation (8), is necessary to ensure that $Y_m$ is continuous.

$$Y_m = y_0 + A_y \cos(2\pi f_{y,m} t + \varphi_m) \quad (5)$$

$$T_m = \frac{1}{2^{M-m}} T, \quad (6)$$
$$m = 1, 2, 3, \ldots, M$$

$$f_{y,m} = f_x - 2^{M-m} \Delta f, \quad (7)$$
$$m = 1, 2, 3, \ldots, M$$

$$\varphi_m = (M-m)\pi, \quad (8)$$
$$m = 1, 2, 3, \ldots, M$$

Figures 3D, 3E, 3F:
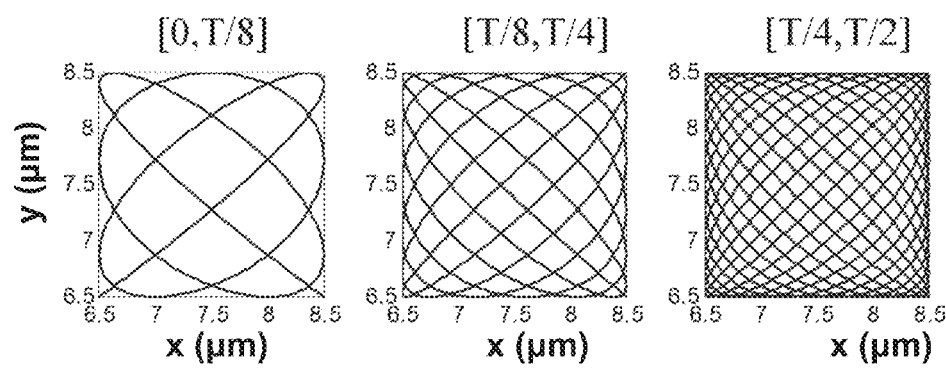
FIGS. 3D to 3F show various scan patterns according to the invention.

FIGS. 3A-3C give the schematics of the designed Lissajous trajectories by the single-tone method with different time durations which are (0, T/4], [T/4, T/2], and (0, T], respectively. The target resolution h=80 nm and the scan range A=2 μm is used in generated Lissajous trajectories. The driving frequencies are $f_x$=1 Hz and $f_y$=0.982 Hz, therefore, the corresponding N=28. FIGS. 3D-3F show an example with a multiresolution method (the multi-frequency method), with M=4 used in calculations. Keeping the maximum target resolution, the scan range, and the x frequency the same as the former parameters. They frequency and the phase in the corresponding time intervals are changed. The y frequency is varied as $f_y$=0.857 Hz, 0.929 Hz, and 0.964 Hz, respectively. The y phase is $\phi$=3π, 2π, π. FIG. 3D is a full period of Lissajous trajectory with T1=T/8. FIGS. 3E and 3F are a half period of Lissajous trajectory with T2=T/4 and T3=T/2, respectively. The former method (FIG. 3A-3D) directly provides patterns used for the surface modifications. And the latter method provides the "preview" function to the process of scratching the surface with low resolution Lissajous trajectories first, then increasing the target resolution of the patterns. Once the requirements of the fabrication are satisfied, the fabrication processes can be stopped.

Ion Beam Micromachining

Increased fabrication speed can be achieved in ion beam micromachining by applying the sinusoidal drive patterns described herein. The ion beam can be of gallium ions, helium ions, neon ions, or any other charged particle. The sinusoidal drive patterns can be applied to moving the substrate, or to moving the beam (such as via the magnetic lens). In addition to sputtering off substrate molecules or atoms, ion beam induced deposition can be used to apply molecules or atoms. Focused ion beam (FIB) microscopy can be used to view the results typically using lower beam currents. Moreover, the FIB device can be a dual-beam device, such that visualization can be by scanning electron microscopy (SEM).

Microscopy

In SEM, scanning transmission electron microscopy (STEM), or FIB microscopy, the electron or ion beam can be moved, or the substrate/stage can be moved using the sinusoidal drive patterns described herein.

In microscopy utilizing scanning electrons or ion beams, the electron or ion beams are typically moved with a raster method. The sinusoidal diver patterns can reduce the damage caused by the beam sample interaction. Also, it provides the advantage that smoother driving waveforms can speed up the imaging and fabrication process without exciting the mechanical scanner's oscillation at higher-order harmonics. Another advantage is the patterns can be operated on non-conductive and electron beam-sensitive materials surfaces. In the very high resolution applications, the methods provides a fast, systematic way to survey the surface.

In a scanning electron microscope, scanning transmission electron microscope, focused ion beam microscope, ion beam micromachining device, or scanning probe nanofabrication device there is an electron beam, ion beam or probe that interacts with the substrate. That electron beam, ion beam or probe can be termed the "scanning modality."

Specific embodiments according to the methods of the present invention will now be described in the following examples. The examples are illustrative only, and are not intended to limit the remainder of the disclosure in any way.

All ranges recited herein include ranges therebetween, and can be inclusive or exclusive of the endpoints. Optional included ranges are from integer values therebetween (or inclusive of one original endpoint), at the order of magnitude recited or the next smaller order of magnitude. For example, if the lower range value is 0.2, optional included endpoints can be 0.3, 0.4, . . . 1.1, 1.2, and the like, as well as 1, 2, 3 and the like; if the higher range is 8, optional included endpoints can be 7, 6, and the like, as well as 7.9, 7.8, and the like. One-sided boundaries, such as 3 or more, similarly include consistent boundaries (or ranges) starting at integer values at the recited order of magnitude or one lower. For example, 3 or more includes 4 or more, or 3.1 or more. If there are two ranges mentioned, such as about 1 to 10 and about 2 to 5, those of skill will recognize that the implied ranges of 1 to 5 and 2 to 10 are within the invention.

Where a sentence states that its subject is found in embodiments, or in certain embodiments, or in the like, it is applicable to any embodiment in which the subject matter can be logically applied.

Example 1

SPN surface modifications and characterization were carried out under ambient conditions by using a Veeco Dimension V AFM with Nanoscope V Controller. Standard tapping mode silicon cantilevers (RTESP, Bruker, nominal spring constant k=40 N/m, resonance frequency $f_0$=350 kHz) were used to effect mechanical scratching. Before the experiments, the deflection sensitivity and the spring constant of the cantilevers were calibrated by using the force distance curves and the thermal tune method (Levy et al., Nanotechnology 13 (1), 33 (2002)), respectively. For sample preparations, a surface treatment was performed to form a monolayer of C18 chains on a clean $Si/SiO_2$ substrate for scratching fabrications. The thickness of the film was ~5 nm as measured by AFM height imaging on the edges of the film. The average surface roughness measured was ~2.5 nm. After scratching, the topography of the modified surfaces can be characterized by tapping mode AFM. For tip triboelectrification experiments (Example 2), PtIr coated cantilevers (NSG03/Pt, NT-MDT, nominal spring constant k=1.74 N/m, resonance frequency $f_0$=90 kHz) were used. The accumulated surface charges were characterized by SKPM. With Dimension V, SKPM can scan twice for each line. Surface morphology can be obtained in the first scan and the surface potential can be measured in the second scan in lift mode with potential feedback. All AFM images were post-processed using Gwyddion software (Nečas et al., Cent. Eur. J. Phys. 10 (1), 181-188 (2012)).

In the first experiment, an SPN tip-scratching method was implemented with a Lissajous trajectory. The trajectory was prepared by a program (as outlined above) and imported into the SPN control software. The normal force applied on the tip (~2 µN) can be calculated by Hook's law by multiplying the deflection sensitivity (~44.16 nm/V), the setpoint value (~1 V) of the contact feedback, and the spring constant of the cantilever (~48.82 N/m). In order to illustrate the fabrication processes more clearly, FIGS. 6A, 6B and 6C are fabricated on the different positions of the sample surface using different time durations. In the first phase, the first quartered period of Lissajous trajectory was used, as shown in FIG. 3A. The tip started moving from the right bottom corner of the squared area to the left up corner, and the trajectory gradually became a circle. The materials on the substrate were removed/scratched by the scanning tip correspondingly, as shown in FIG. 6A. In the second quartered period, as shown in FIG. 6B, the trajectory evolves from a circle to a line and finally moves to the upper right corner of the square. The diagonally opposite corner was added in scan area and the center round area was scanned again from different directions. The result of scratched surface is shown in FIG. 6B. This method is advantageous in that if there are some particles left in the center of the scratched area after finishing the first quartered period scan, in the second quartered period most of the particles can be swept out by the tip. FIG. 3C shows a full period of Lissajous trajectory which can be seen as the overlap of FIGS. 3A and 3B and then a repetition once in the opposite direction. A square area is covered by using this trajectory. FIG. 6C shows the corresponding square-shaped scratched surface with a full period of Lissajous trajectory. The inset in the right portion of FIG. 6C shows the surface height scale bar, as applicable to FIGS. 6A to 6C. The monolayer film on the substrate has been removed. FIGS. 6D-6F are the corresponding cross-section lines marked in FIGS. 6A-6C, respectively.

In the second experiment, the multiresolution Lissajous trajectories were used for surface modifications. The scan method was designed by following the idea of "preview" of the scanned area, Within the same time frame, the surface was scratched with low resolution Lissajous patterns first and then the target resolution of the patterns was gradually increased. The normal force was set at the same value as in the first experiment. FIGS. 7A-7C show the morphology of the scratched areas. To illustrate the fabrication processes, FIG. 7A shows the morphology of the scratched area with the trajectory as showed in FIG. 3D. FIG. 7B shows the surface morphology after scratched with the trajectories showed in FIG. 3D. FIG. 7C shows the surface morphology after scratched with the trajectories in FIG. 3F. The inset in the right portion of FIG. 7C shows the surface height scale bar, as applicable to FIGS. 7A to 7C. From the scratched results, in the first period of the fabrication process (T/8), because the target resolution was too low, the scratched area could not be completely distinguished. Then in the next period (T/8) the resolution of Lissajous pattern was increased. The scratched area could be seen, because the trajectory covered most of the squared area. But the resolution of the trajectory needed to be further improved since a lot of debris was present on the scratched surface. In the third period (T/4), because the resolution of Lissajous pattern was increased, most of the debris on the scratched area was swept to the border of the area. From these time-lapse frames, this function can be compared to the preview function in imaging experiments.2° FIGS. 7D-7F are the corresponding cross-section lines marked in FIGS. 7A-7C, respectively.

Example 2

Figure 8A:
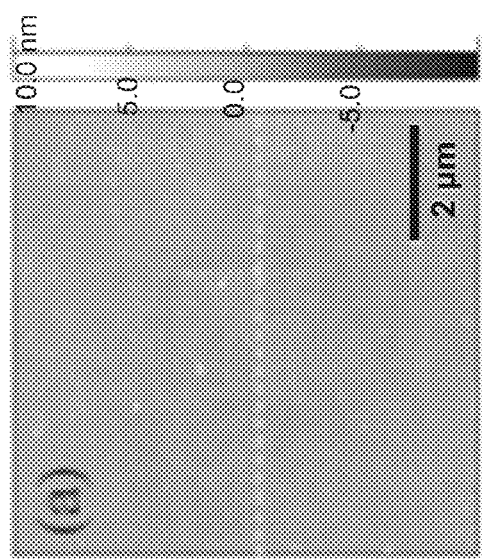
FIG. 8A shows scanning probe microscopy of the product of a fabrication by triboelectrification.
Figure 8B:
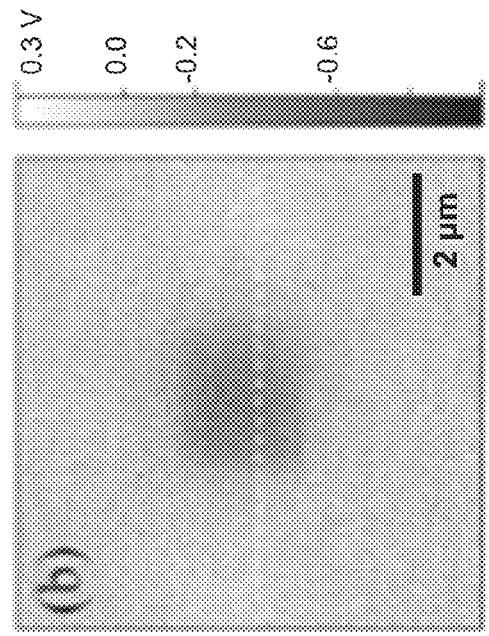
FIG. 8B shows surface potential mapping of the product of a fabrication by triboelectrification.
Figure 8C:
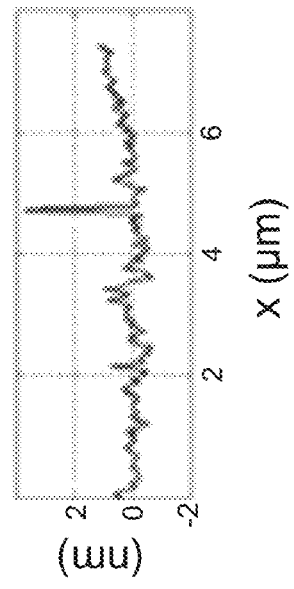
FIGS. 8C and 8D show cross-section lines from the scanning probe microscopy and surface potential mapping represented in FIGS. 8A and 8B.
Figure 8D:
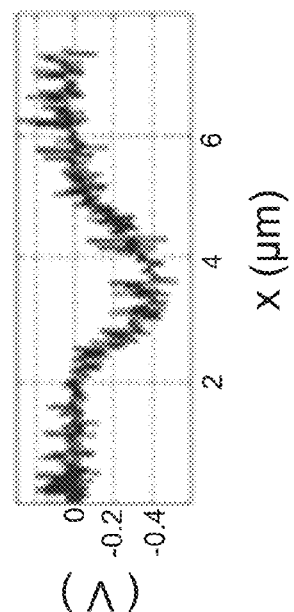

As another application, a tip-based triboelectrification fabrication with Lissajous patterns was conducted. By using a silicon AFM tip to contact a silicon dioxide surface, negative charges are generated and accumulated on the rubbed surface during scanning. The surface potential generated by the charges are characterized by SKPM. In experiments, for in situ modification and characterization, a worn-out conductive AFM tip was used. Contacting the surface with silicon tip and sensing the electrostatic field can be simultaneously satisfied. For charge generation in contact mode, the trajectory used is the same as in the FIG. 3C. The cantilever deflection sensitivity (~32.10 mn/V), the setpoint value (~0.2 V), and the force constant (~1.63 N/m) were calibrated before the fabrications. The normal force (~10 nN) was evaluated with Hook's law by multiplying these parameters. Two cycles of the Lissajous trajectory were performed in charge generation mode, such that the squared area was rubbed for four times. Then SKPM mode was operated for mapping the surface charges. In this mode, an AC voltage was applied to the tip with the amplitude ~560 mV and the frequency ~2 kHz which was below the resonance frequency of the cantilever (~100.4 kHz). The lift height was set to 50 nm. FIG. 8A gives the topographic image of the silicon dioxide surface after rubbing and FIG. 8B shows the corresponding surface potential mapping. The insets in the right of both figures show the surface height scale bar and the surface potential scale bar, respectively. From the topographic image, slight signs of wear were found on the surface because of the lateral force between the tip and the substrate. And in the surface potential mapping, the rubbed area shows a lower potential indicating that the negative triboelectric charges accumulated in this area. FIGS. 8C and 8D are the corresponding cross-section lines marked in FIGS. 8A and 8B, respectively. The cross-section lines of the surface potential indicate that the rubbed area is ~0.4V lower than the surrounding areas.

The invention can be described further with reference to the following numbered embodiments:

Embodiment 1

A method of creating a pattern with a scanning probe nanofabrication device or an ion beam micromachining device comprising moving, with an enclosed sinusoidal trajectory, a substrate upon which the pattern will be formed relative to (a) a tip of the scanning probe nanofabrication device or (b) the ion beam.

Embodiment 2

The method of a numbered embodiment, wherein the scanning probe nanofabrication operates by scratching, dip-pen, oxidation, thermo, thermos-chemical, bias-induced, current-induced or triboelectification scanning probe nanofabrication.

Embodiment 3

The method of a numbered embodiment, where the pattern includes a rectangular shape.

Embodiment 4

The method of a numbered embodiment, wherein the scanning probe nanofabrication device or ion beam micromachining device, as the case may be, operates in a microscopy mode, and wherein the device is programed to be capable of serially applying to a fabrication region of the substrate two or more enclosed sinusoidal trajectories configured to serially apply greater line density to the fabrication region, wherein prior to conducting one or more of the subsequent trajectories, the device is operated in microscopy mode over the fabrication region, and wherein (a) fabrication is aborted or corrected (e.g., the enclosed sinusoidal trajectory reprogrammed) if such microscopy determines defects, or (b) fabrication ends if such microscopy determines the fabrication meets standards.

Embodiment 5

The method of a numbered embodiment, wherein the scanning probe nanofabrication device is used.

Embodiment 6

The method of a numbered embodiment, wherein the ion beam micromachining device is used.

Embodiment 7

A method of conducting scanning electron microscopy, scanning transmission electron microscopy, or focused ion beam microscopy comprising moving, with an enclosed sinusoidal trajectory, a substrate of microscopic analysis relative to the electron or ion beam.

Embodiment 8

The method of a numbered embodiment, wherein scanning electron microscopy is conducted.

Embodiment 9

The method of a numbered embodiment, wherein scanning transmission electron microscopy is conducted.

Embodiment 10

The method of a numbered embodiment, wherein focused ion beam microscopy is conducted.

Embodiment 11

The method of a numbered embodiment, wherein a rectangular region of the substrate is examined.

Embodiment 12

A scanning electron microscope, scanning transmission electron microscope, focused ion beam microscope, ion beam micromachining device, or scanning probe nanofabrication device, wherein the microscope or device is configured to move a substrate and a scanning modality relative to one another with an enclosed sinusoidal trajectory, wherein scanning probe nanofabrication device the device is configured for scratching, dip-pen, oxidation, thermo, thermos-chemical, bias-induced, current-induced or triboelectification scanning probe nanofabrication.

Embodiment 13

The microscope or device of a numbered embodiment, which is a scanning electron microscope.

Embodiment 14

The microscope or device of a numbered embodiment, which is a scanning transmission electron microscope.

Embodiment 15

The microscope or device of a numbered embodiment, which is a focused ion beam microscope.

Embodiment 16

The microscope or device of a numbered embodiment, which is a ion beam micromachining device.

Embodiment 17

The microscope or device of a numbered embodiment which is a scanning probe nanofabrication device.

Embodiment 18

The ion beam micromachining device, or scanning probe nanofabrication device of a numbered embodiment, wherein the device operates in a microscopy mode, and wherein the device is programed to be capable of serially applying to a fabrication region of the substrate two or more enclosed sinusoidal trajectories configured to serially apply greater line density to the fabrication region, wherein the device is configured to, prior to conducting one or more of the subsequent trajectories, operate in microscopy mode over the fabrication region, and wherein the device is programmed to do one or more of (a) abort or correct the fabrication if such microscopy determines defects, or (b) end the fabrication if such microscopy determines the fabrication meets standards.

Embodiment 19

The scanning electron microscope, scanning transmission electron microscope or focused ion beam microscope of a numbered embodiment, wherein the device is programed to be capable of serially applying to a pattern region of the substrate two or more enclosed sinusoidal trajectories configured to serially apply greater line density to the pattern region, wherein the device is configured to end a microscopic analysis prior to a higher density trajectory if such microscopy determines the analysis meets standards.

This invention described herein is of a SPN device, other microfabrication device, microscopy devices, and methods of using and forming the same. Although some embodiments have been discussed above, other implementations and applications are also within the scope of the following claims. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

What is claimed is:

1. A method of creating a pattern with a scanning probe nanofabrication device or an ion beam micromachining device comprising moving and fabricating, with an enclosed sinusoidal trajectory, a substrate upon which the pattern will be formed relative to (a) a tip of the scanning probe nanofabrication device or (b) the ion beam.

2. The method of claim 1, wherein the scanning probe nanofabrication fabricates by scratching, dip-pen, oxidation, thermo, thermo-chemical, bias-induced, current-induced or triboelectification methodology.

3. The method of claim 1, where the pattern includes a rectangular shape.

4. The method of claim 1, wherein the scanning probe nanofabrication device or ion beam micromachining device, as the case may be, operates in a microscopy mode, and wherein the device is associated with a controller having memory, and the controller is capable of executing programming stored in the memory for serially applying to a fabrication region of the substrate two or more enclosed sinusoidal trajectories configured to serially apply greater line density to the fabrication region, wherein prior to conducting one or more of the subsequent trajectories, the device is operated in microscopy mode over the fabrication region, and wherein (a) fabrication is aborted or corrected if such microscopy determines defects, or (b) fabrication ends if such microscopy determines the fabrication meets standards.

5. The method of claim 1, wherein the tip of the scanning probe nanofabrication device is moved relative to the substrate.

6. The method of claim 1, wherein the ion beam micromachining device is moved relative to the substrate.

7. A method of conducting scanning electron microscopy, scanning transmission electron microscopy, or focused ion beam microscopy comprising moving and microscopically scanning, with an enclosed sinusoidal trajectory, a substrate of microscopic analysis relative to (a) a tip of a scanning electron microscopy or scanning transmission electron microscopy device or (b) the ion beam.

8. The method of claim 7, wherein the tip of a scanning electron microscopy device is moved relative to the substrate.

9. The method of claim 7, wherein the tip of a scanning transmission electron microscopy device is moved relative to the substrate.

10. The method of claim 7, wherein the ion beam of a focused ion beam microscopy device is moved relative to the substrate.

11. The method of claim 7, wherein a rectangular region of the substrate is examined.

12. A scanning electron microscope, scanning transmission electron microscope, focused ion beam microscope, ion beam micromachining device, or scanning probe nanofabrication device, comprising the microscope or device configured to move a substrate and a scanning or fabricating modality relative to one another with an enclosed sinusoidal trajectory, wherein scanning probe nanofabrication device the device is configured to fabricate by scratching, dip-pen, oxidation, thermo, thermo-chemical, bias-induced, current-induced or triboelectrification methodology.

13. The microscope or device of claim 12, wherein the microscope or device is a scanning electron microscope.

14. The microscope or device of claim 12, wherein the microscope or device is a scanning transmission electron microscope.

15. The microscope or device of claim 12, wherein the microscope or device is a focused ion beam microscope.

16. The microscope or device of claim 12, wherein the microscope or device is an ion beam micromachining device.

17. The microscope or device of claim 12, wherein the microscope or device is a scanning probe nanofabrication device.

18. The ion beam micromachining device, or scanning probe nanofabrication device of claim 12, comprising the device configured to operate in a microscopy mode, and wherein the device is programmed to be capable of microfabricating by serially applying to a fabrication region of the substrate two or more enclosed sinusoidal trajectories configured to serially apply greater line density to the fabrication region, wherein the device is configured to, prior to conducting one or more of the subsequent trajectories, operate the device in the microscopy mode over the fabrication region, and wherein the device is programmed to do one or more of (a) abort or correct the fabrication if such microscopy determines defects, or (b) end the fabrication if such microscopy determines the fabrication meets standards.

19. The scanning electron microscope, scanning transmission electron microscope or focused ion beam microscope of claim 18, comprising the device programmed to be capable of microscopically scanning by serially applying to a pattern region of the substrate two or more enclosed sinusoidal trajectories configured to serially apply greater scanning line density to the pattern region, wherein the device is configured to end a microscopic analysis prior to a higher density trajectory if such microscopy determines the analysis meets standards.

* * * * *